United States Patent [19]
Rieder et al.

[11] Patent Number: 5,305,330
[45] Date of Patent: Apr. 19, 1994

[54] SYSTEM COMPRISING A LASER DIODE AND MEANS FOR STABILIZING THE WAVELENGTH OF LIGHT EMITTED BY SAID LASER DIODE, AND LASER INTERFEROMETER

[75] Inventors: Heinz Rieder, Oberndorf; Max Schwaiger, Ostermiething, both of Austria

[73] Assignee: RSF-Elektronik Gesellschaft m.b.H., Tarsdorf, Austria

[21] Appl. No.: 39,959

[22] Filed: Mar. 30, 1993

[30] Foreign Application Priority Data
Apr. 2, 1992 [AT] Austria .................................. 677/92

[51] Int. Cl.$^5$ .............................................. H01S 3/13
[52] U.S. Cl. ...................................... 372/29; 372/32; 356/345; 356/349; 356/351; 356/352
[58] Field of Search .................... 372/29, 32; 356/345, 356/349, 351, 352

[56] References Cited
U.S. PATENT DOCUMENTS

| | | | |
|---|---|---|---|
| 4,824,251 | 4/1989 | Slotwinski et al. | 356/351 |
| 4,862,467 | 8/1989 | Carter et al. | 372/29 |
| 5,127,731 | 7/1992 | DeGroot | 372/29 |
| 5,172,185 | 12/1992 | Leuchs et al. | 356/345 |
| 5,179,424 | 1/1993 | Lequime et al. | 356/345 |

FOREIGN PATENT DOCUMENTS
3911473 10/1990 Fed. Rep. of Germany .
3930273 3/1991 Fed. Rep. of Germany .

Primary Examiner—Georgia Y. Epps
Attorney, Agent, or Firm—Collard & Roe

[57] ABSTRACT

In a system comprising a laser diode and means for stabilizing the wavelength of a primary beam of light emitted by said laser diode said means comprise a controller for controlling the current supplied to the laser diode under the control of sensor means, which are responsive to the instantaneous ambient conditions and operating parameters, a beam splitter, which is disposed in the path of said primary beam and arranged to divert from said primary beam a partial beam to measuring means, which comprise a diffraction grating and associated focusing optical means and are arranged to direct said partial beam onto photodetector means and to form on said photodetector means a light spot having a position and/or size depending on the instantaneous wavelength of said primary beam. The photodetector means serve to detect deviations of the light spot from a desired position, which is associated with the rated wavelength of said primary beam. The output signals of said photodetector means are optionally converted and are used as control signals for the controller. A laser interferometer is also disclosed, in which the polarization of the primary beam is used in the generation of the measured-value signals.

17 Claims, 2 Drawing Sheets

SYSTEM COMPRISING A LASER DIODE AND MEANS FOR STABILIZING THE WAVELENGTH OF LIGHT EMITTED BY SAID LASER DIODE, AND LASER INTERFEROMETER

BACKGROUND OF THE INVENTION

1. Field of the Invention

This invention relates to a system comprising a laser diode and means for stabilizing the wavelength of a primary beam of light emitted by said laser diode, wherein said means comprise a controller for controlling the current supplied to the laser diode under the control of sensor means, which are responsive to the instantaneous ambient conditions and operating parameters, a beam splitter, which is disposed in the path of said primary beam and arranged to divert from said primary beam a partial beam to measuring means, which comprise photodetector means, which are illuminated by said partial beam via optical means with an intensity that varies in dependence on the wavelength of said primary beam, which photodetector means are operable to deliver output signals, which are optionally converted and are delivered as control signals to said controller.

This invention relates also to a laser interferometer which comprises a system as defined in the preceding paragraph, a second beam splitter for splitting said primary beam into a reference beam directed to a stationary reflector and a measuring beam, which is directed to a movable reflector that is adapted to be connected to a movable object, and reflecting means for diverting the reflected beams to photodetector means, which are connected to counters for detecting the fluctuations of the brightness resulting from the interference of the reflected beams during a movement of the movable reflector.

2. Description of the Prior Art

For numerous applications it is desired to stabilize the wavelength of a light bundle. One of such applications is the transmission of information in an optical waveguide. But the problems involved will subsequently mainly be discussed with reference to an interferometer.

Laser diodes have previously been used in laser interferometers only in special cases. DE-A-39 11 473 discloses stabilizing means of the kind described hereinbefore in conjunction with the laser diode of a laser interferometer. In that case the light emitted by the laser diode is split into a plurality of partial beams, the length of which is transmitted by respective monomode optical fibers. One of said fibers leads to a lens, from which the measuring light beam is directed along the measuring path. A second fiber transmits reference light to a receiver, and the measuring light beam is diverted by an adjustable measuring prism and is transmitted by a lens and the light of the measuring beam is subsequently transmitted by a further fiber to said receiver and in said receiver is caused to interact with said reference beam with interference.

For stabilizing the wavelength, light of two further beams is diverted and is transmitted by optical fibers of equal length to an additional interference generator to interact therein with interference. The exit openings of said optical fibers are arranged one beside the other so that the projected light beams can interfere and in the photodiodes spaced from the exit openings generate electric signals having an intensity that varies in dependence on the wavelength. A constant distance between the light exit openings and the photodetectors must be maintained for the measurement and for the stabilization of the wavelength.

From DE-A-39 30 273 it is known to use in a laser interferometer a solid-state laser, which is stimulated by at least one laser diode and converts the light emitted by the laser diode in the infrared range to light of a different wavelength. That solid-state laser consists, e.g., of a neodymium solid-state laser and can be used to stabilize the beam and the wavelength. To stabilize the wavelength a separate measuring interferometer is used, which receives a partial light beam, which has been diverted from the measuring beam. Any changes of the wavelength will result in the measuring interferometer in corresponding bright-dark changes, which can be utilized for an automatic control. That automatic control results either in a change of the current supplied to the stimulating laser diode or in a change of the control of the resonator surfaces of the solid-state laser.

As has been explained hereinbefore the accuracy of the measurement of length by an interferometer will depend on the fact that the wavelength of the laser light employed is known and is maintained constant. In single-frequency lasers the number of bright-dark changes is counted which in case of an adjustment of the movable reflector result from the interference between the reference beam and the measuring beam. In that case $\Delta l = m\lambda/2$, wherein $\Delta l$ is the change of the path length, $m$ is the number of bright-dark changes, and $\lambda$ is the wavelength of the laser.

The intensity of the light which is received by the photodetectors varies according to a sine function. The resolution may be increased by the use of suitable circuits.

The wavelength depends on the frequency of the source of laser light and on the refractive index of the medium in which the light is transmitted. $\lambda = C/l$ and $C = C^o/n$, where C is the velocity of light in a medium, $C^o$ is the velocity of light in a vacuum, l is the frequency of the source of laser light, and n is the refractive index. n will depend, inter alia, on the temperature, the humidity, the pressure of the air p, and the composition of the air. n can be calculated according to the so-called Edlen formula.

Commercially available interferometers comprise stable sources of laser light, such as Zeeman-stabilized He-Ne lasers. In the measurement, the air parameters are detected individually or by means of so-called wavelength trackers are detected jointly. If stabilized sources of laser light are employed, the frequency and, as a result, the wavelength cannot be changed and cannot be automatically controlled by usable control means but each result of the measurement must be corrected in computers with suitable correcting data.

Contrary to the stabilized He-Ne lasers, the frequency of laser diodes can often change in dependence on various operating parameters and such changes may often be undesirable. The frequency and wavelength will change particularly in dependence on temperature and on the current supplied to the laser diode. For instance, for a laser diode which is commercially available under the designation "HL7801 E", $\Delta\lambda/\Delta T = 0.06$ nm/° C. and $\Delta\lambda/\Delta I = 0.006$ nm/mA.

The frequency may also change in dependence on the ageing of the laser diode. A use of the means known in conjunction with stabilized lasers for a correction of the result of measurement would be too expensive and would not give sufficiently accurate results. For this reason it has been attempted in the operation of laser diodes to stabilize the wavelength by a control of the current supplied to the laser diode. In that case the ambient conditions and operating parameters are detected by separate sensor means and a feedback loop for controlling the current supplied to the laser diode is operated in response to said sensor means.

SUMMARY OF THE INVENTION

It is a first object of the invention to provide a system which is of the kind that has been described in the first paragraph of this description and in which the wavelength of the laser diode can be stabilized with simple means.

A second object of the invention is to provide a laser interferometer in which the wavelength is stabilized by a system provided to accomplish the first object and which permits an improved evaluation of the results of the measurement and a higher resolution to be achieved by the use of simple final evaluating means.

The first object stated hereinbefore is accomplished in said system in that the measuring means comprise a diffraction grating with or without focusing optical means for focusing the deflected partial beam so that the position and/or size of the area occupied by a light spot which is formed by said optical means on photodetector means will depend on the instantaneous wavelength of the primary beam and the photodetector means will detect any deviation of the light spot from the desired area, which is associated with a rated wavelength of said primary beam.

The position and/or area of the light spot (focal spot) formed by the partial beam which has been diffracted and focused will depend on the wavelength in the transmitting medium and in case of proper measurements said wavelength will correspond to the wavelength in the path used for the measurement. The focusing which is effected results in a high selectivity so that even slight deviations of the wavelength can be used to generate appropriate control signals, i.e., for a feedback control, and the wavelength can actually be stabilized within very close limits. Various structural designs may be employed within the scope of the invention.

According to a preferred feature of the system in accordance with the invention the light spot is focused during an operation at the rated wavelength on a gap between two photodetectors consisting particularly of photodiodes and is shifted to one photodiode in response to an increase of the wavelength and to the other photodiode in response to a decrease of the wavelength so that the output signal of the photodetectors will represent the instantaneous deviation. Such a system is very simple and permits the output signal of the photodetectors to be used directly for the control of the current supplied to the laser diode.

According to a further preferred feature of the system, the diffraction grating consists of an echelette grating, i.e., of a grating having grating elements which are sawtooth-shaped in a longitudinal sectional view.

According to a further preferred feature of the system, the diffraction grating is a self-focusing concave grating. In that case it is not necessary to provide separate optical means for focusing.

According to a further feature of the system the laser diode is powered via an analog adder, which has inputs connected to a constant-current source and via an integrator to an amplifier for amplifying the current from the photodiodes; said analog adder generates a sum current and supplies said sum current to the laser diode. In that case the photodiodes may be connected in opposition so that the analog adder may increase and decrease the current relative to the rated current delivered by the constant-current source. The integrator may constitute a low-pass filter in order to avoid a hunting in the automatic control.

The use of a system in accordance with the invention to stabilize the wavelength permits in accordance with the invention the utilization of another property of laser diodes for a novel design of a laser interferometer. That special property of laser diodes resides in that the light emitted by them exhibits a substantially linear polarization.

In a laser interferometer which is of the kind described in the second paragraph of this description the above-mentioned second object is accomplished in accordance with the invention in that the second beam splitter is a polarizing beam splitter for polarizing the primary beam in a plane which includes an angle of 45° with the reference beam, which is normal to the measuring beam, so that the polarization planes of the reference and measuring beams include an angle of 90°, the polarized reflected beams are directed before or after they are diverted through at least one lambda/4 plate having ordinary and extraordinary axes which include angles of 45° with the polarization planes of the two reflected beams so that two circularly polarized waves are generated, which are combined in a combined beam to produce a resultant wave, which is linearly polarized in a direction which depends on the position of the movable reflector relative to the stationary reflector, and is rotated about the axis of said combined beam in response to an adjustment of the movable reflector, and said combined beam is divided by a neutral beam splitter into two partial beams, which are directed to respective polarizing beam splitters, which are adapted to project four light beams in an (assumed) 0° plane, a 90° plane, a 45° plane and a 135° plane, onto said photodetectors, and two measuring signal trains are generated preferably in that the output signals of pairs of the photodetectors, are combined in phase opposition in antiparallel circuits.

In such an arrangement either of the signal trains will lead the other in dependence on the direction in which the movable reflector has been adjusted so that the measuring signal trains which have been generated will definitely indicate also the direction in which the movable reflector has been adjusted. Countable binary signals may be derived from the signal trains and be delivered to conventional counting circuits, which are known in connection with incremental measuring systems. Even the resolution can be increased by means of multiplier circuits or interpolating computers, known per se. But the essential advantage resides in the fact that conventional evaluating means may be used in an only slightly modified form. The laser interferometer defined hereinbefore is similar to the design of the standard laser interferometer in that the reference beam is diverted from the primary beam at right angles to the latter and the measuring beam is projected in the same direction as the primary beam. Other designs may be adopted, in which the light is deflected through different angles and in that case the inclination of the plane of the polarization of the primary beam and the positions of the reflectors and beam splitters will have to be modified accordingly.

A simple design of the laser interferometer will be achieved if, according to a preferred feature of the invention, the reflecting means are succeeded by a common lambda/4 plate, in which the diverted beams are combined. In connection with lambda/4 plates the "ordinary" and "extraordinary" axes are also known as fast and slow axes, respectively.

According to a further preferred feature of the laser interferometer the second beam splitter constitutes the reflecting means for diverting the reflected beams and at least one lambda/4 plate is arranged in the paths for said diverted beams. A common lambda/4 plate or two separate lambda/4 plates may be arranged in the paths for the two diverted beams.

DETAILED DESCRIPTION OF THE PREFERRED EMBODIMENT

Figure 1:
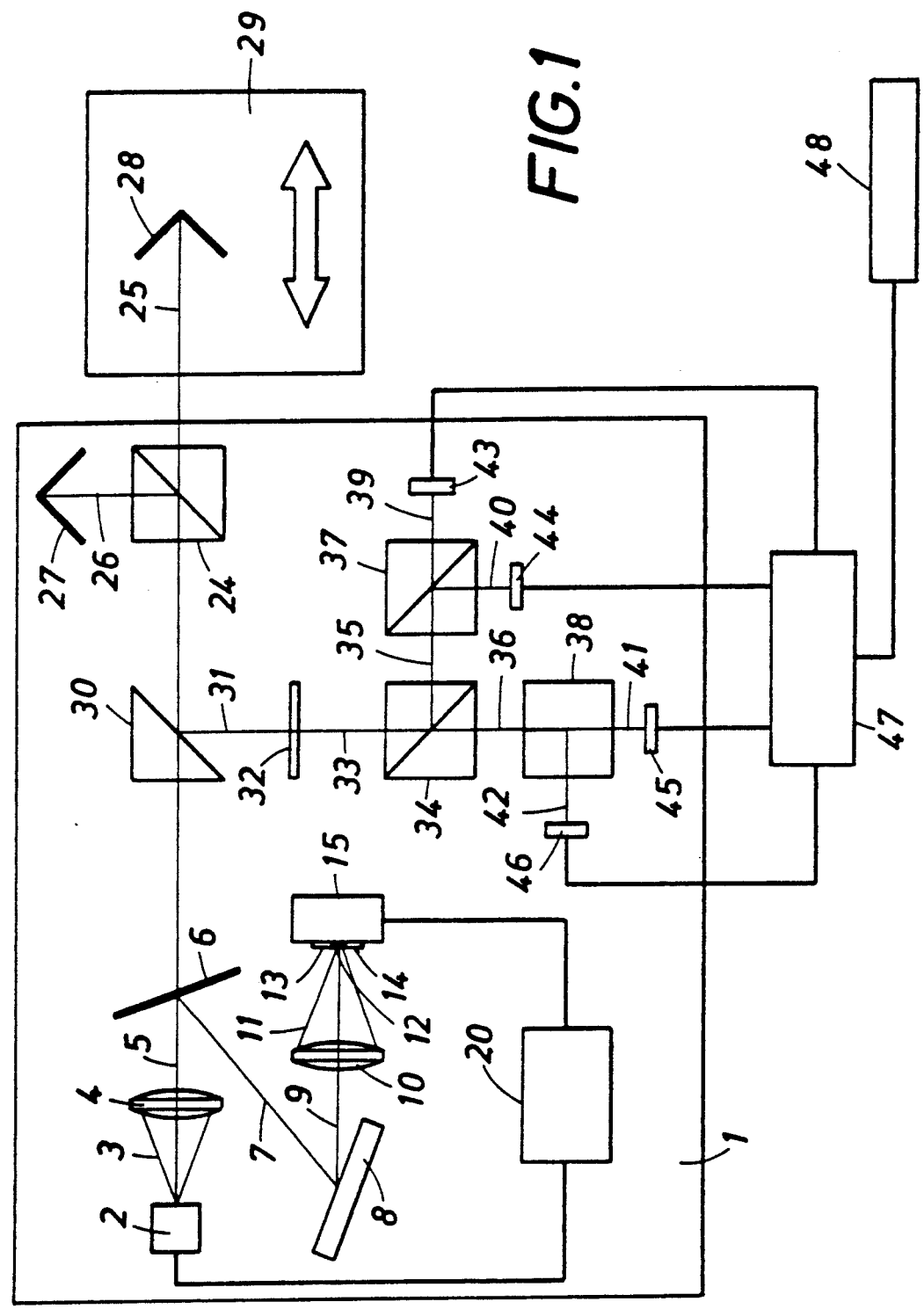
FIG. 1 is a highly schematic top plan view and a block scheme showing a laser interferometer in accordance with an illustrative embodiment of the invention.
Figure 2:
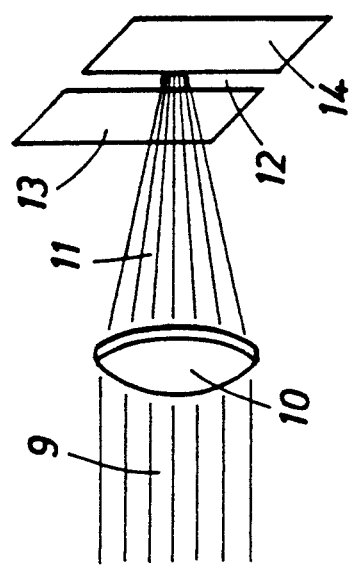
FIG. 2 shows means for focusing the partial beam on two photodetectors in order to explain the mode of operation of the stabilizing system.

Further details and advantages of the invention will become apparent from the following description with reference to the drawing.

According to FIG. 1 all essential elements of a single-frequency laser interferometer with the exception of the movable reflector are mounted on a common baseplate 1, which is made of a material that has a very low coefficient of expansion, e.g., of invar. A laser diode 2 emits a divergent light bundle 3, which is collimated by a lens 4, which projects a primary beam 5 of polarized light. The laser diode 2 is so adjusted that the light of the primary beam 5 is polarized in a plane which is inclined 45° from the horizontal and from the direction in which light is projected by a beam splitter, which will be described hereinafter.

The means for stabilizing the wavelength will now be described. Said means comprise a beam splitter 6, by which a partial beam 7 is diverted from the primary beam 5 and is directed to a phase grating 8, by which the partial beam is diffracted and which projects light 9 in a direction which depends on the wavelength. The diffracted light passes through a positive lens 10 or other converging optical means and is focused thereby. If the frequency of the laser diode 2 corresponds to the rated wavelength, the waist of the focused beam portion 11 will be disposed in the gap 12 between two photodiodes 13, 14. In response to a change of the wavelength, the light spot will be shifted by a distance $$\Delta z = \frac{f \Delta \lambda}{\cos \beta g}$$

wherein
f is the focal length of the lens 10
$\Delta \lambda$ is the wavelength change
$\beta$ is the diffraction angle and
$\beta$ is the grating constant In the present example the calculation shows that in case of f=60 mm, $\beta$=70° and g=0.5 micrometers a wavelength change of 0.008 nm will result in a change $\Delta z$ of 0.28 micrometers. In case of a wavelength $\lambda$ of 800 nm this will correspond to a deviation of the result of measurement by about 1 ppm. From these data it is also apparent why a stiff and compact structure has been selected as well as a plate 1 consisting of a material having a very low coefficient of expansion, such as zerodur or invar.

Figure 3:
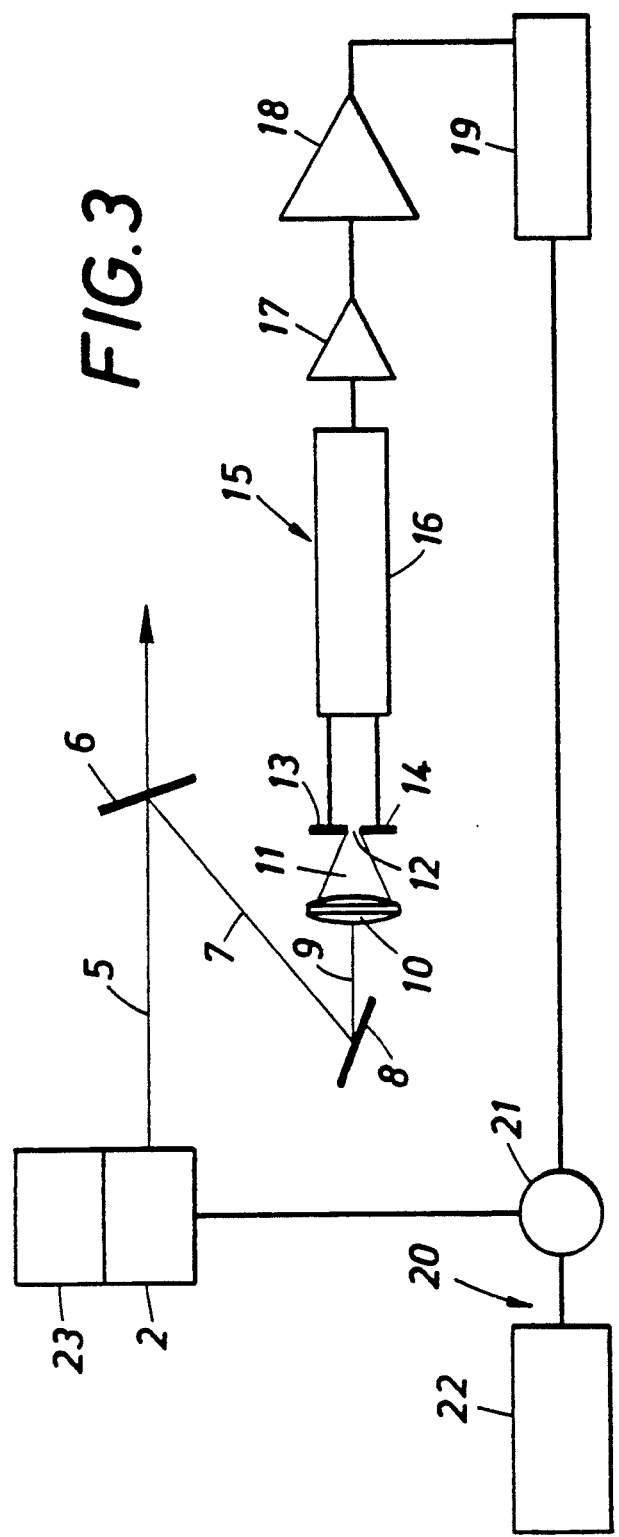
FIG. 3 is a block circuit diagram of the means for energizing the laser diode.

The two diodes 13, 14 may alternatively consist of a twin diode and a differential signal derived from their output signals is processed further in an evaluating circuit 15, which is shown in FIG. 3 to comprise a current-to-voltage converter 16, a preamplifier 17, and an integrator 18 as well as a voltage-to-current converter 19. Owing to the provision of an operational amplifier the integrator serves also as a low-pass filter. The output signal of the evaluating circuit 15 is delivered to a power source 20 for the laser diode 2. According to FIG. 3 said power source comprises a constant-current source 22 and a controller consisting of an analog adder 21. In the analog adder 21 the output signals from 15 are used to modulate the constant current from source 22 in order to change the current value of the energizing current supplied to the laser diode in such a manner that the focal spot or the waist of the focused light bundle 11 will be held in the gap 12 because the frequency is adapted to the instantaneous ambient conditions and operating parameters and the wavelength is thus maintained constant. The laser diode 2 is provided with a Peltier cooler 23. Even the slightest changes of the position of the focal spot will result in a strong signal. On the other hand, changes of the intensity of the partial beam 7 will produce only slight results, if any. If the diffraction grating 8 is made of a material having a very small coefficient of expansion, the diffraction angle will also be independent of temperature. In a practical example the gap 12 had a width of 5 micrometers and the focal spot 20 was 20 micrometers in diameter.

The laser interferometer will now be described further with reference to FIG. 1. As has been mentioned hereinbefore the primary beam 5 is polarized in a plane which is inclined from the horizontal by 45°. The primary beam 5 is split by a polarizing beam-splitting cube 24 into a measuring beam 25, which is aligned with the primary beam 5, and a reference beam 26, which has been deflected at right angles. Because a polarizing beam splitter is used, the two beams 25 and 26 are polarized in planes which are at right angles to each other. After traversing a predetermined reference path the beam 26 is incident on a stationary triple reflector 27 and the beam 25 is incident on a movable triple reflector 28, which is firmly connected to and can be adjusted in unison with the movable part of the interferometer, such as a measuring carriage 29.

The reflected beams which have been reflected by 27 and 28 are combined in the beam splitter 24 and are diverted at right angles by a mirror or a reflecting prism 30. The two diverted beams are jointly designated 31. Because they have different polarizations, they cannot yet interact to produce interference. For this reason they are transmitted by a lambda/4 plate, which has ordinary and extraordinary axes which include angles of 45° with the polarization planes of the two partial beams; said planes are at right angles to each other. The diverted beams 31 which have been transmitted by the plate 32 are combined in a combined beam 33 and constitute two waves, which have mutually opposite circular polarizations and which are combined in the combined beam 33 to form a resultant wave having linear polarization. The vector of the direction of the polarization will depend on the position of the movable reflector 28 relative to the stationary reflector 27 and in response to an adjustment of the movable reflector will be rotated about the axis of the combined beam 33 in a sense which depends on the direction of the adjustment. In a neutral beam splitter 34 the combined beam 33 is then split into two partial beams 35, 36, which are directed to respective polarizing beam-splitting cubes 37, 38. Said beam-splitting cubes 37, 38 are inclined 45° relative to each other so that the four light beams 39, 40, 41 and 42 projected by them are polarized in planes at angles of 0°, 90°, 45° and 135°, respectively. The intensity of said light beams will depend on the angle of the polarization of the light that has been projected by the lambda/4 plate 32 and will change with the rotation of that polarization so that an adjustment of the measuring carriage 29 will have the result that pairs of sinusoidal signals displaced 90° in phase relative to each other will be generated by the photodetectors 43, 44, 45, 46 and will be delivered to evaluating means 47. In said evaluating means 47 the pairs of signals are processed in phase opposition in antiparallel circuits to provide two measured-value signals, which are displaced 90° in phase and from which all d.c. components have been eliminated by the antiparallel circuit. By methods known from incremental measuring systems said measured-value signals are converted to countable digital signals, which are delivered to indicating or control means 48. To increase the resolution an electronic subdivision of said countable signals can be effected in processes known per se by means of multiplier circuits. For the sake of simplicity only one line has been drawn in FIG. 1 for the light path between components 24, 27, 28, 30, and 32 although parallel light paths will be established in that case for the measuring beam 25, the reference beam 26, the reflected measuring beam, and the reflected reference beam.

The diffraction grating 8 may consist of an echelette grating. Alternatively the diffraction grating 8 and the optical means 10 may be replaced by a concavely curved, focusing diffraction grating. Finally, the reflected beams may already be diverted by the correspondingly designed beam-splitting cube 24. In a further alternative the common lambda/4 plate 32 may be replaced by two lambda/4 plates, which are disposed in the light paths 25, 26, respectively, for the reflected beams before the beam-splitting cube 24.

We claim:

1. In a system comprising a laser diode for emitting a primary beam of light, a power source for supplying energizing current to said laser diode, and means for stabilizing the wavelength of said primary beam, wherein said stabilizing means comprise:

sensor means which are responsive to the instantaneous ambient conditions and to operating parameters of said system, a controller for controlling said energizing current in response to said sensor means, a first beam splitter disposed in the path of said primary beam and arranged to divert from said main beam a partial beam, measuring means, which are included in said sensor means and arranged to receive said partial beam and comprise photodetector means, which are arranged to be illuminated by said partial beam in dependence on the wavelength of said primary beam and are arranged to deliver control signals in response to said illumination to said controller, the improvement residing in that said measuring means comprise a diffraction grating arranged to receive said partial beam and to project a diffracted partial beam so as to form on said photodetector means a light spot occupying an area which depends on the instantaneous wavelength of said primary beam, said diffraction grating is arranged to form said light spot on a predetermined area when said wavelength is a predetermined rated wavelength, and said photodetector means are arranged to change said control signals in response to a change of said area resulting from a deviation of said wavelength from said rated wavelength.

2. The improvement set forth in claim 1, wherein means are provided for converting said control signals before they are delivered to said controller.

3. The improvement set forth in claim 1, wherein said diffraction grating is arranged to focus said diffracted light beam on said photodetector means.

4. The improvement set forth in claim 1, wherein optical means for focussing said diffracted light beam on said photodetector means are provided between said diffraction grating and said photodetector means.

5. The improvement set forth in claim 1, wherein said diffraction grating is arranged to form said light spot on said photodetector means on an area having a position depending on the instantaneous wavelength of said primary beam.

6. The improvement set forth in claim 1, wherein said diffraction grating is arranged to form said light spot on said photodetector means on an area having a size depending on the instantaneous wavelength of said primary beam.

7. The improvement set forth in claim 1, wherein said photodetector means comprise two laterally spaced apart photodetectors defining between them a gap, focusing means are arranged to focus said light spot on said gap when said wavelength is at said rated wavelength, and said diffraction grating is arranged to shift said light spot from said gap to either of said two photodetectors in response to a deviation of said wavelength from said rated wavelength.

8. The improvement set forth in claim 7, wherein said two photodetectors consist of photodiodes.

9. The improvement set forth in claim 1, wherein said diffraction grating consists of an echelette grating.

10. The improvement set forth in claim 1, wherein said diffraction grating consists of a focusing concave grating.

11. The improvement set forth in claim 1, wherein said sensor means comprise an amplifier for amplifying said output signals of said photodetector means, and an integrator succeeding said amplifier, said power source comprises a constant-current source, and said controller comprises an analog adder, which has inputs connected to said integrator and to said constant-current source and an output connected to said laser diode.

12. The improvement set forth in claim 11, wherein said integrator constitutes a low-pass filter.

13. In a laser interferometer for measuring the movements of a movable object, comprising
   a laser diode for emitting a primary beam of light, a power source for supplying energizing current to said laser diode, and means for stabilizing the wavelength of said primary beam, which stabilizing means comprise sensor means which are responsive to the instantaneous ambient conditions and to operating parameters of said system, a controller for controlling said energizing current in response to said sensor means, a first beam splitter disposed in the path of said primary beam and arranged to divert from said main beam a partial beam, measuring means, which are included in said sensor means and arranged to receive said partial beam and comprise photodetector means, which are arranged to be illuminated by said partial beam in dependence on the wavelength of said primary beam and are arranged to deliver control signals in response to said illumination to said controller, which laser interferometer also comprises a second beam splitter arranged to receive said primary beam of light from said first beam splitter and to split said primary beam into a reference beam and a measuring beam, a stationary reflector arranged to receive said reference beam and to reflect a first reflected beam, a movable reflector adapted to be connected to said object and arranged to receive said measuring beam and to reflect a second reflected beam, reflecting means arranged to receive and divert said first and second reflected beams and to project first and second diverted beams, which are arranged to interact with interference, second photodetector means arranged to receive light from said first and second diverted beams and to generate output signals depending on the interference between said first and second diverted beams, and counting means for receiving said output signals from said second photodetector means so as to detect said interference, the improvement residing in that said measuring means comprise a diffraction grating arranged to receive said partial beam and to project a diffracted partial beam so as to form on said photodetector means a light spot occupying an area which depends on the instantaneous wavelength of said primary beam, said diffraction grating is arranged to form said light spot on a predetermined area when said wavelength is a predetermined rated wavelength, and said photodetector means are arranged to change said control signals in response to a change of said area resulting from a deviation of said wavelength from said rated wavelength, said second beam splitter is arranged to direct said reference beam normally to said measuring beam, said second beam splitter is a polarizing beam splitter for polarizing said primary beam in a first plane, which includes an angle of 45° with said reference beam, and for polarizing said reference beam in a second plane, which is at right angles to said first plane, lambda/4 plate means arranged to transmit light of said first and second reflected beams and having ordinary and extraordinary axes which include an angle of 45° with said first and second planes, respectively, and arranged to generate circularly polarized waves in said first and second reflected beams, means are provided for combining said first and second reflected beams in a combined beam, whereby said circularly polarized waves generate a resultant wave, which has linear polarization in a direction which depends on the position of said movable reflector relative to said stationary reflector and is arranged to rotate about the axis of said combined beam in response to a movement of said movable reflector, a neutral third beam splitter, which is arranged to receive said combined beam and to split said combined beam into two partial beams, two polarizing beam splitters, which are arranged to receive said two partial beams and to project first, second, third, and fourth light beams, which are polarized in respective planes at angles of 0°, 90°, 45°, and 135°, respectively, wherein said second photodetector means comprise first, second, third, and fourth photodetectors arranged to receive said first, second, third, and fourth light beams, respectively, and antiparallel circuit means are provided for combining said output signals of said first and second photodetectors and of said third and fourth photodetectors, respectively, in phase opposition and for generating two measured-value signal trains, which are displaced 90° in phase.

14. The improvement set forth in claim 13, wherein said lambda/4 plate means are disposed between said second beam splitter and said reflecting means.

15. The improvement set forth in claim 13, wherein said lambda/4 plate means are disposed between said reflecting means and said third beam splitter.

16. The improvement set forth in claim 15, wherein said lambda/4 plate means consist of a single lambda/4 plate, which is arranged to combine said first and second diverted beams.

17. The improvement set forth in claim 13, wherein said reflecting means are constituted by said second beam splitter, said lambda/4 plate means comprise two lambda/4 plates, which are arranged to receive said first and second reflected beams and to project said first and second reflected beams to said second beam splitter, and said second beam splitter is arranged to combine said first and second deflected beams in said combined beam.

* * * * *